US008506921B2

(12) United States Patent
Hauge et al.

(10) Patent No.: US 8,506,921 B2
(45) Date of Patent: Aug. 13, 2013

(54) PRODUCTION OF VERTICAL ARRAYS OF SMALL DIAMETER SINGLE-WALLED CARBON NANOTUBES

(75) Inventors: Robert H. Hauge, Houston, TX (US); Ya-Qiong Xu, Ithaca, NY (US)

(73) Assignee: William Marsh Rice University, Houston, TX (US)

( * ) Notice: Subject to any disclaimer, the term of this patent is extended or adjusted under 35 U.S.C. 154(b) by 275 days.

(21) Appl. No.: 12/278,736

(22) PCT Filed: Feb. 6, 2007

(86) PCT No.: PCT/US2007/061671
§ 371 (c)(1),
(2), (4) Date: Nov. 17, 2008

(87) PCT Pub. No.: WO2007/092835
PCT Pub. Date: Aug. 16, 2007

(65) Prior Publication Data
US 2012/0145997 A1 Jun. 14, 2012

Related U.S. Application Data

(60) Provisional application No. 60/765,986, filed on Feb. 7, 2006.

(51) Int. Cl.
*D01C 5/00* (2006.01)
(52) U.S. Cl.
USPC ............... 423/447.3; 423/447.1; 977/843; 977/742
(58) Field of Classification Search
USPC ............... 423/447.1, 447.3; 977/742, 842, 977/843
See application file for complete search history.

(56) References Cited

U.S. PATENT DOCUMENTS

| 5,051,030 | A | 9/1991 | Saha |
| 5,296,404 | A | 3/1994 | Akahori et al. |
| 5,994,261 | A | 11/1999 | Tai et al. |
| 7,057,203 | B2* | 6/2006 | Mao et al. ............... 257/10 |
| 7,144,624 | B2* | 12/2006 | Knowles et al. ............ 428/364 |
| 7,691,720 | B2* | 4/2010 | Furukawa et al. ............ 438/413 |
| 2003/0122133 | A1 | 7/2003 | Choi et al. |

FOREIGN PATENT DOCUMENTS

WO 2005/078819 8/2005

OTHER PUBLICATIONS

Goichi Takeda, Lujun Pan, Seiji Akita and Yoshikazu Nakayama; "Vertically Aligned Carbon Nanotubes Grown at Low Temperatures for Use in Displays", Japanese Journal of Applied Physics vol. 44, No. 7B, 2005, pp. 5642-5645.*
Minjae Jung, Kwang Yong Eun, Jae-Kap Lee, Young-Joon Baik, Kwang-Ryeol Lee, Jong Wan Park, Growth of carbon nanotubes by chemical vapor deposition, Diamond and Related Materials, vol. 10, Issues 3-7, Mar.-Jul. 2001, pp. 1235-1240, ISSN 0925-9635, 10.1016/S0925-9635(00)00446-5. (http://www.sciencedirect.com/science/article/pii/S0925963500004465.*

(Continued)

*Primary Examiner* — Stanley Silverman
*Assistant Examiner* — Richard M Rump
(74) *Attorney, Agent, or Firm* — Winstead PC

(57) ABSTRACT

A hot filament chemical vapor deposition method has been developed to grow at least one vertical single-walled carbon nanotube (SWNT). In general, various embodiments of the present invention disclose novel processes for growing and/or producing enhanced nanotube carpets with decreased diameters as compared to the prior art.

18 Claims, 7 Drawing Sheets

(56) References Cited

OTHER PUBLICATIONS

Chien-Chao Chiu, Tsung-Yen Tsai, Nyan-Hwa Tai, Chi-Yong Lee, Synthesis of ultra long vertically aligned carbon nanotubes using the rapid heating and cooling system in the thermal chemical vapor deposition process, Surface and Coatings Technology, vol. 200, Issue 10, Feb. 24, 2006, pp. 3215-3219, ISSN 0257-8972. Online Aug. 2005.*

Cheung et al. "Diameter-Controlled Synthesis of Carbon Nanotubes" J. Phys. Chem. B, 2002, 106 (10), pp. 2429-2433.*

Flame Synthesis of Metal-Catalyzed Single-Wall Carbon Nanotubes Randall L. Vander Wal, Thomas M. Ticich and, and Valerie E. Curtis The Journal of Physical Chemistry A 2000 104 (31), 7209-7217.*

Ikuno, et al., "Influence of the plasma condition on the morphology of vertically aligned carbon nanotube films grown by RF plasma chemical vapor deposition", Surf. Rev. Lett., 10:2003, pp. 611-615.

Hussain, et al., "Ferric-sulfate-catalyzed hot filament chemical vapour deposition carbon nanotube synthesis", Nanotechnology, 14:2003, pp. 925-930.

Chen, et al., "Quasi-one-dimensional nanostructures and efficient heat transfer in nanoscale devices", Proc. SPIE Int. Soc. Opt. Eng., 6003:2005, pp. 6003:M1-M13.

Hata, et al., "Water-Assisted Highly Efficient Synthesis of Impurity-Free Single-Walled Carbon Nanotubes", Science, 306:2004, pp. 1362-1364.

Eres, et al., "Molecular Beam-Controlled Nucleation and Growth of Vertically Aligned Single-Wall Carbon Nanotube Arrays", J. Phys. Chem. B, 109:2005, pp. 16684-16694.

Zhang, et al., "Ultra-high-yield growth of vertical single-walled carbon nanotubes: Hidden roles of hydrogen and oxygen", Proc. Nat. Acad. Sci., 102:2005, pp. 16141-16145.

Iwasaki, et al., "Direct Evidence for Root Growth of Vertically Aligned Single-Walled Carbon Nanotubes by Microwave Plasma Chemical Vapor Deposition", J. Phys. Chem. B, 109:2005, pp. 19556-19559.

Zhong, et al., "Low Temperature Synthesis of Extremely Dense and Vertically Aligned Single-Walled Carbon Nanotubes", Jpn. J. Appl. Phys., 44:2005, pp. 1558-1561.

Maruyama, et al., "Growth process of vertically aligned single-walled carbon nanotubes", 403:2005, pp. 320-323.

Huang, et al., "Growth of Millimeter-Long and Horizontally Aligned Single-Walled Carbon Nanotubes on Flat Substrates", J. Am. Chem. Soc., 125:2003, pp. 6636-5637.

Maruyama, et al., "Low-temperature synthesis of high-purity single-walled carbon nanotubes from alcohol", Chem. Phys. Lett., 360:2002, pp. 229-234.

Murakami, et al., "Direct synthesis of high-quality single-walled carbon nanotubes on silicon and quartz substrates", Chem. Phys. Lett., 377:2003, pp. 49-54.

Murakami, et al., "Growth of vertically aligned single-walled carbon nanotube films on quartz substrates and their optical anisotropy", Chem. Phys. Lett., 385:2004, pp. 298-303.

Xu, et al., "Vertical Array Growth of Small Diameter Single Walled Carbon Nanotubes", J. Am. Chem. Soc., 128:2006, pp. 6560-6561.

Gyula et al., "Molecular beam-controlled nucleation and growth of vertically aligned single-wall carbon nanotube arrays", J. Phys. Chem. B, 2005, 109, 16684.

Bronikowski et al., "Gas-phase production of carbon single-walled nanotubes from carbon monoxide via the HiPco process: A parametric study" J. Vac. Sci. Technol., 2001, 19, 1800.

Nikolaev et al., "Gas-phase catalytic growth of single-walled carbon nanotubes from carbon monoxide", Chem. Phys. Lett., 1999, 313, 91.

Thess et al., "Crystalline Ropes of Metallic Carbon Nanotubes", Science, 1996, 273.

Bachilo et al., "Structure-Assigned optical spectra of single-walled carbon nanotubes", Science, 2002, 298, 2361.

* cited by examiner

PRODUCTION OF VERTICAL ARRAYS OF SMALL DIAMETER SINGLE-WALLED CARBON NANOTUBES

GRANT INFORMATION

This invention was made with U.S. Government support under Grant No. DE-FC36-05GO15073, awarded by the U.S. Department of Energy; Grant No. DE-Ac05-000R22725, also awarded by the U.S. Department of Energy; and Grant No. AFRL-F33615-01-D5802, awarded by the U.S. Department of Defense. The Government has certain rights in this invention.

BACKGROUND OF THE INVENTION

1. Field of the Invention

The present invention generally relates to method of fabrication of vertical arrays of nanotubes.

BACKGROUND

Carbon nanotubes are nanoscale high-aspect-ratio cylinders consisting of hexagonal rings of carbon atoms that may assume either a semiconducting electronic state or a conducting electronic state. Semiconducting carbon nanotubes have been used to form hybrid devices, such as hybrid FET's. In particular, FET's have been fabricated using a single semiconducting carbon nanotube as a channel region. Typically, ohmic contacts at opposite ends of the semiconducting carbon nanotube extending between a source electrode and a drain electrode situated on the surface of a substrate.

A gate electrode is defined in the substrate underlying the carbon nanotube and generally between the source and drain electrodes. An oxidized surface of the substrate defines a gate dielectric situated between the buried gate electrode and the carbon nanotube. Such FET's switch reliably while consuming significantly less power than a comparable silicon-based device structure due to the small dimensions of the carbon nanotube.

Accordingly, much attention has been given to the use nanomaterials in semiconductor devices.

Many methods exist for forming and/or creating nanotubes and nanotube arrays. A conventional method of forming carbon nanotubes utilizes a chemical vapor deposition (CVD) process. Specifically, the CVD process directs a flow of a carbonaceous reactant to a catalyst material located on the substrate, where the reactant is catalyzed to synthesize carbon nanotubes. The carbon nanotubes are capable of being lengthened by insertion of activated carbon atoms at the interface with the catalyst material. Typically, the carbon nanotubes are then collected for an end use or further processing.

Carbon nanotubes typically range from a few to tens of tens in diameter, and are as long as a few nanometers in length. Because of its one-dimensional electronic properties due to this shape anisotropy, the carbon nanotube characteristically has a maximum current density allowing the flowing of current without disconnection of 1,000,000 A per square centimeter, which is 100 times or more as high as that of a copper interconnect. Further, with respect to heat conduction, the carbon nanotube is ten times as high in conductivity as copper.

In terms of electric resistance, it has been reported that transportation without scattering due to impurities or lattice vibration (phonon) can be realized with respect to electrons flowing through the carbon nanotube. It is known that resistance per carbon nanotube, in various instances, is approximately 6.45 k$\Omega$. However, other resistances are contemplated in various embodiments of the present invention.

Further desirable attributes of a carbon nanotube electrode material include such factors as high surface area for the accumulation of charge at the electrode/electrolyte interface, good intra- and interparticle conductivity in the porous matrices, good electrolyte accessibility to the intrapore surface area, chemical stability and high electrical conductivity. Commonly used carbonaceous material used for the construction of carbon nanotubes include such materials as activated carbon, carbon black carbon fiber cloth, highly oriented pyrolytic graphite, graphite powder, graphite cloth, glassy carbon, carbon aerogel, and/or the like.

Typically, nanotubes can be classified into horizontal architectures and vertical architectures. Horizontal nanotubes exhibit carrier flow from source to drain in a direction parallel to the horizontal plane of the substrate on which they are formed. Vertical nanotubes exhibit carrier flow from source to drain in a direction vertical to the horizontal plane of the substrate on which they are formed.

It is commonly understood that vertical nanotubes provide and/or allow for a shorter switching time because channel length for vertical nanotubes does not depend on the smallest feature size resolvable by, for example, lithographic equipment and methods. Therefore, vertical nanotubes possess a higher power handling capacity than typical horizontal nanotubes.

Previous studies have shown that carpets (forests) of single-walled carbon nanotubes can be readily grown at atmospheric pressures with controlled mixtures containing various hydrocarbons and also in the presence of hydrogen and various hydrocarbons at sub-atmospheric pressures with activation of gas mixtures via plasma formation by microwave or RF discharges. It all cases, however, production of small diameter SWNT was not optimized with the use of substrate heating in the presence of an activated gas. Previous studies have also shown that hot filament activation of gas mixtures of hydrogen and hydrocarbons activates the growth of multi-walled carbon nanotubes in the presence of metal catalysts. Hata, et al., *Science* 2004, 306, 1362; Gyula, et al., *J. Phys. Chem. B* 2605, 109, 16684; Zhang, et al., *PNAS* 2005, 102, 16141; Iwasaki, et al., *J. Phys. Chem. B* 2005, 109, 19556; Zhong, et al, *J. Appl. Phys,* 2005, 44, 1558; Mamyama, et al., I 2005, 403, 320; Huang et al., *J. Am Chem. Soc.* 2003, 125, 5636.

Accordingly, the art field is in search of improved methods of manufacturing semiconductor devices out of nanotube material, such as carbon nanotubes, especially improved methods of production a predominantly single walled decreased diameter arrays/forests of nanotubes.

SUMMARY OF THE INVENTION

These and other features and advantages of the invention will be apparent to those skilled in the art from the following detailed description of various embodiments, taken together with the accompanying figures and claims, in which:

Various embodiments of the present invention comprise processes for methods of fabrication and, more particularly, to methods of producing at least one vertical nanotube and/or an array of such vertical nanotubes. Such methods of production provide for at least one of decreased nanotube diameter, increased nanotube purity, process control, and/or the like.

Further, various embodiments of the present invention are capable of being combined with conventional nanotube growth methods where the an embodiment of the present invention is capable of being used to define a nanotubes diameter followed by growing of the nanotube under conventional growth environments. Accordingly, various embodiments of the present invention are capable of use as an early stage growth process wherein the foundation of at least one nanotube is fabricated.

More particularly, generally, embodiments of the present invention comprise a method for producing at least one carbon nanotube comprising then steps of:

1. Placement of at least one catalyst particle on a suitable nanotube growth substrate;
2. Activating at least one gas in the presence of a carbon containing species;
3. Heating a nanotube growth substrate with the at least one activated gas, wherein at least one nanotube is produced. In an alternate embodiment, an array of nanotubes is produced.

Accordingly, various embodiments of the present invention disclose a method for producing at least one vertical small diameter single walled nanotube, said method comprising the step of placing at least one catalyst on a nanotube growth substrate surface; contacting the substrate with a gas mixture comprising hydrogen and a carbon containing species in a reaction chamber; heating the substrate and said activated gas; and, activating the gas mixture, wherein at least one vertical small diameter nanotube is produced at or about said at least one catalyst on said nanotube growth substrate.

Alternate embodiments further comprise the step of further growing said at least one nanotube by a conventional growth process.

In various embodiments, the at least one nanotube grows at about 2.5 μm per minute.

The nanotubes produced according to embodiments of the present invention can be used in any of a number of semiconductor devices, as is known in the art.

Further embodiments disclose a method of reducing the heat generated from an integrated circuit comprising the step of replacing said integrated circuit's silicon with a carbon nanotube formation as herein disclosed.

Further embodiments disclose a method of increasing the operating speed of a semiconductor device comprising the step of replacing said integrated circuit's silicon with a carbon nanotube formation as herein disclosed.

In various further embodiments, a semiconductor device is fabricated from the at least one nanotube. In further embodiments, an array of devices if fabricated.

BRIEF DESCRIPTION OF THE FIGURES

In order that the manner in which the above-recited and other enhancements and objects of the invention are obtained, a more particular description of the invention briefly described above will be rendered by reference to specific embodiments thereof which are illustrated in the appended drawings. Understanding that these drawings depict only typical embodiments of the invention and are therefore not to be considered limiting of its scope, the invention will be described with additional specificity and detail through the use of the accompanying drawings in which.

DETAILED DESCRIPTION OF THE INVENTION

Figure 1:
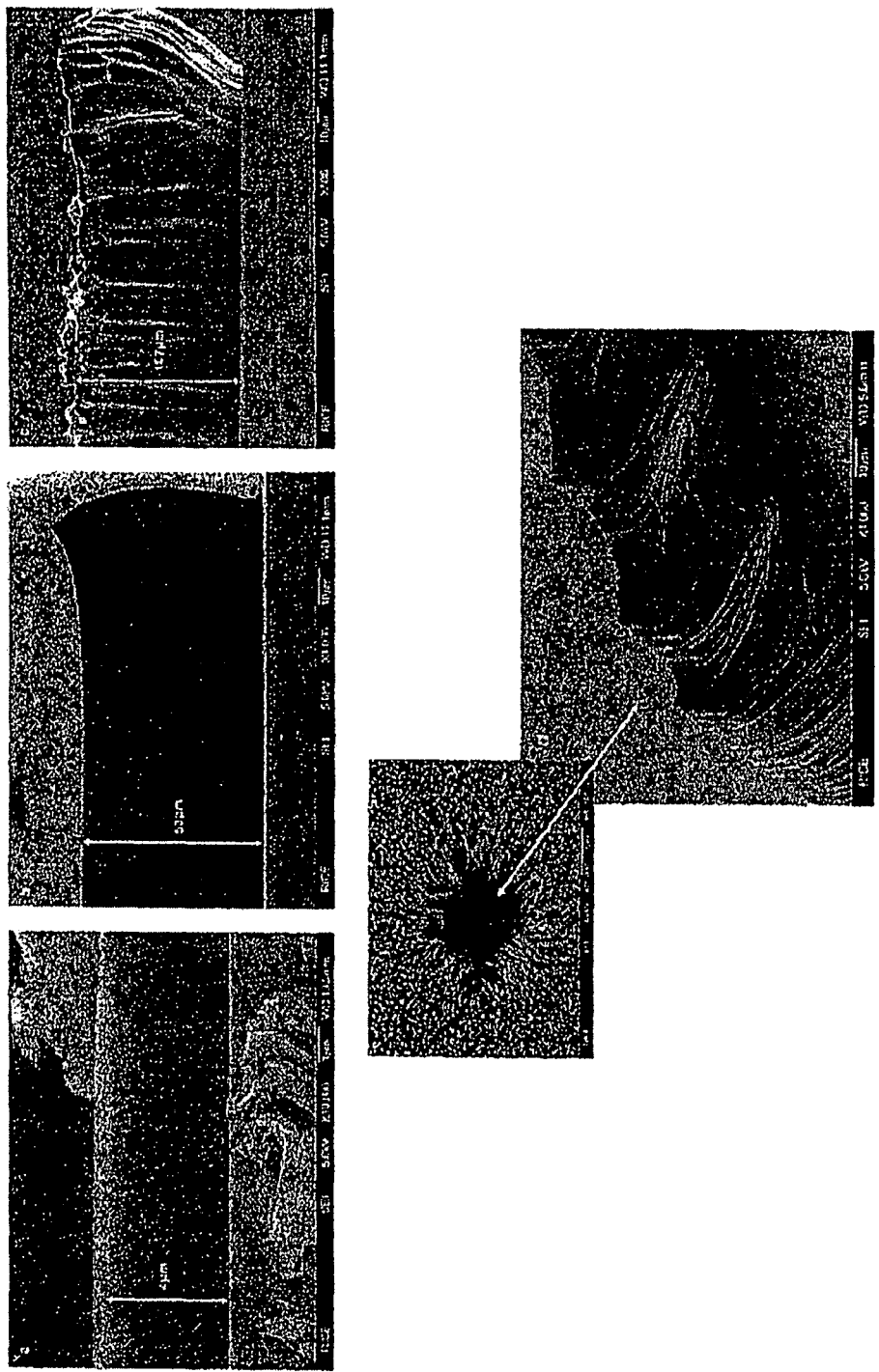
FIG. 1 are images of a Scanning Electron Microscope (SEM) from various carpets of Single Walled Nanotubes (SWNTs) grown for different time periods; (a) 1.3 minutes, scale bar 1 nm; (b) 20 minutes, scale bar 10 μm; (c) 40 minutes, scale bar 10 nm; (d) inside view of the sample grown with 40 minutes, scale bar 10 nm, inset image scale bar 1 nm.

The particulars shown herein are by way of example and for purposes of illustrative discussion of the preferred embodiments of the present invention only and are presented in the cause of providing what is believed to be the most useful and readily understood description of the principles and conceptual aspects of various embodiments of the invention. In this regard, no attempt is made to show structural details of the invention in more detail than is necessary for the fundamental understanding of the invention, the description taken with the drawings making apparent to those skilled in the art how the several forms of the invention may be embodied in practice.

The following definitions and explanations are meant and intended to be controlling in any future construction unless clearly and unambiguously modified in the following examples or when application of the meaning renders any construction meaningless or essentially meaningless. In cases where the construction of the term would render it meaningless or essentially meaningless, the definition should be taken from Webster's Dictionary, $3^{rd}$ Edition.

As used herein, the term "attached," or any conjugation thereof describes and refers the at least partial connection of two items.

As used herein, the term "dielectric" means and refers to a substance in which an electric field may be maintained with zero or near-zero power dissipation, i.e., the electrical conductivity is zero or near zero. In various embodiments, a dielectric material is an electrical insulator.

As used herein, a "fluid" is a continuous, amorphous substance whose molecules move freely past one another and that has the tendency to assume the shape of its container, for example, a liquid or a gas.

As used herein, the term "integral" means and refers to a non-jointed body.

As used herein, the term "optical anisotropy" means and refers to a the property of being optically directionally dependent. Stated another way, it is the behavior of a medium, or of a single molecule, whose effect on electromagnetic radiation depends on the direction of propagation of the radiation.

As used herein, the term "reaction chamber" means and refers to a gas activation zone. The reaction chamber is capable of being defined by walls or other boundaries, but also is capable of comprising a zone or other unrestricted area.

As used herein, the term "semiconductor device" means and refers at least one device used in or with a formation of transistors, capacitors, interconnections, batteries, supercapacitors, and/or the like, particularly various memory devices, such as, but not limited to DRAM, SRAM, SCRAM, EDRAM, VDRAM, NVSRAM, NVDRAM, DPSRAM, PSDRAM, transistor/capacitor cell devices, vias or interconnects, and vertical stacks of logic gates. However, other devices utilizing transistors at least one transistors, capacitors, interconnections, and/or the like are to be included within this definition.

As used herein, the term The term "trace" is not intended to be limiting to any particular geometry or fabrication technique and instead is intended to broadly cover an electrically conductive path.

Other than in the operating examples, or where otherwise indicated, all numbers expressing quantities of ingredients or reaction conditions used herein are to be understood as modified in all instances by the term "about".

References herein to terms such as "vertical" and "horizontal" are made by way of example to establish a frame of reference. The term "horizontal" as used herein is defined as a plane parallel to the conventional plane or surface of substrate. The term "vertical" refers to a direction perpendicular to the horizontal, as defined above. Terms, such as "on", "above", "below", "side" (as in "sidewall"), "higher", "lower", "over", "beneath" and "under", are defined with respect to the horizontal plane.

As such, various embodiments of the present invention comprise novel processes for growing and/or producing enhanced nanotube carpets comprising vertical nanotubes with decreased diameter as compared to the prior art. In an embodiment, the nanotube carpets grown according to embodiments of the present invention comprise nanotubes with diameters less than about 3 μm. In an alternate embodiment, the nanotube carpets grown according to embodiments of the present invention comprise nanotubes with diameters less than about 2 nm. In an alternate embodiment, the nanotube carpets grown according to embodiments of the present invention comprise nanotubes with diameters less than about 1 nm. In general, various embodiments of the present invention are capable of growing any size nanotubes.

In general, processes of the present invention combine heating of at least one nanotube growth substrate containing at least one metal catalyst in the presence of an activated gas and carbon source, wherein the gas activation involves production of atomic hydrogen. In various embodiments, the gas activation produces a mixture of atomic hydrogen and various hydrocarbons. Generally, any mixture of atomic hydrogen and a hydrocarbon will work.

Various embodiments of the present invention comprise gas with varied components. In an embodiment, the gas comprises at least one carbon containing constituent. In an alternate embodiment, the gas comprises at least one non-carbon containing constituent with the carbon containing constituent. Any carbon containing constituent can be used. In various embodiments a hydrocarbon is used. Hydrocarbons provide a good source of carbon and a good source of Hydrogen, upon activation. Suitable hydrocarbons include both paraffin's, olefins, ringed structures, branched structures, hydrocarbon with functional groups, and/or the. Generally, any component with carbon will work.

In general, heating of the gas and/or substrate activates the gas. In an embodiment, both the gas and the substrate are in a reaction chamber. In an alternate embodiment, the gas is preheated prior to introduction to the substrate. In an alternate embodiment, the substrate is preheated prior to introduction to the gas.

In various embodiments, the substrate and the gas are heated together. In an embodiment, the substrate and gas are heated from about room temperature to a final temperature.

Various methods of heating can be used. For example, a hot filament can be used for heating. Further processes and apparatuses for activating a gas include those disclosed in U.S. Pat. Nos. 5,296,404 (the '404 patent); 5,994,261 (the '261 patent); and/or, the like, the contents of which are hereby incorporated by reference as if they were presented herein in their entirety.

The '404 patent discloses a method for forming a thin film, comprising the steps of: generating a plasma in a plasma generation chamber by action of an electric field generated by a microwave and a magnetic field generated by an exciting coil arranged around; and introducing the generated plasma into a reaction chamber, resulting in forming a thin film on a sample placed on a sample stage.

The '261 patent discloses a pitch-type fiber convertible to an activated carbon fiber is infusiblized with an infusiblizing gas and the infusiblized fiber is activated with an activating gas, such as steam, to produce an activated carbon fiber. The waste gas from the infusiblizing step is utilized in a combusting step. The combustible component of the waste gas from the activating step is separated out of the waste gas from the activating step and combusted in the combusting step along with the waste gas from the infusiblizing step. The resulting heat from the combusting step is utilized to preheat the infusiblizing gas and the activating gas and the preheated gases are utilized in the infusiblizing step and the activating step, respectively. This arrangement allows the infusiblizing temperature and the activating temperature to be accurately controlled. Thus, an activated carbon fiber is manufactured continuously without being negatively affected by waste gases from the infusiblizing and activating steps.

For embodiments utilizing hot filaments, the acceptable temperatures of the filaments have been from about 100° C. to about 6000° C. However, generally the filament may be any temperature capable of activating at least one of the components comprising the mixture. In an embodiment, a hot filaments is at a temperature greater than about 2000° C. and generally temperatures greater than about 600° C. have also shown to be effective at activating a gas of the present invention. In an embodiment, a temperature between about 125° C. and about 4000° C. is used. In an alternate embodiment, a temperature between about 150° C. and about 2000° C. is used. In an alternate embodiment, a temperature between about 200° C. and about 1500° C. is used. In an alternate embodiment, a temperature between about 250° C. and about 1000° C. is used. In an alternate embodiment, a temperature between about 300° C. and about 900° C. is used. In an alternate embodiment, a temperature between about 400° C. and about 750° C. is used. In an alternate embodiment, a temperature between about 500° C. and about 600° C. is used. However, in general, any temperature can be used.

In an embodiment it is desired to use a lower temperature to prevent and/or hinder nanotube aggregation. It has been experienced at increased temperatures that growing nanotubes tend to aggregate.

In various embodiments of the present invention, various pressures can be used in a reaction chamber. In an embodiment, the reaction chamber is at about atmospheric pressure. In an alternate embodiment, a sub-atmospheric pressure is maintained in the reaction chamber. In an alternate embodiment, a hyper-atmospheric pressure is maintained in the reaction chamber. In yet an alternate embodiment, a vacuum is maintained in the reaction chamber. Generally, any pressure may be used with various embodiments of the present invention.

In various embodiments, the pressure and temperature can be varied dependently, such that one is dependent upon the other, such that a temperature and pressure are capable of being varied during process optimization. In an alternate embodiment, the pressure and temperature are independent.

However, in various embodiments, gas activation by any method, such as gas discharges that produce atomic hydrogen in significant amounts, in combination with heating of a nanotube growth substrate in the presence of the activated atomic hydrogen is capable of forming a small diameter single wall carbon nanotubes, depending at least upon the size of the catalyst.

In various embodiments, the percentage of activated gas is capable of being varied. In an embodiment, a large portion of the reaction chamber comprises activated gas. In an embodiment, the contents of the volume of the reaction chamber is at least 90% activated gas. In an alternate embodiment, the contents of the volume of the reaction chamber is at least 75% activated gas. In an alternate embodiment, the contents of the volume of the reaction chamber is at least 65% activated gas. In an alternate embodiment, the contents of the volume of the reaction chamber is at least 50% activated gas. In an alternate embodiment, the contents of the volume of the reaction chamber is at least 35% activated gas. In an alternate embodiment, the contents of the volume of the reaction chamber is at least 25% activated gas. In an alternate embodiment, the contents of the volume of the reaction chamber is at least 5% activated gas. In general, any percentage component of activated gas is capable of use with varying embodiments of the present invention.

In various embodiments of the present invention, placement of at least one metal catalyst on the growth substrate can be varied. In an embodiment, the at least one metal catalyst uniformly covers the growth substrate. In an alternate embodiment, placement of the catalyst on the nanotube growth substrate is varied, such that the nanotube growth can be varied or patterned. In general, any catalyst formation may be used.

Catalysts of the present invention can be affixed to the nanotube growth substrate by any method common in the art. In an embodiment, catalysts of the present invention are affixed to the substrate by a vapor deposition method, such as, but not limited to chemical vapor deposition (CVD)). Other suitable methods include placement of clusters of catalyst on the substrate, placement of atoms of catalyst on substrate, and/or the like.

In various embodiments, the size of the catalysts at least partially determines the resulting size of the grown nanotube. Accordingly, a process requiring and/or desiring a nanotube of diameter less than 1 nm should use a catalyst, such as a metal catalyst, with a diameter less than 1 nm. In this manner, a design characteristic for the grown nanotube is the diameter and/or size of the catalyst and process and/or product can be varied by varying catalyst size.

In an embodiment, the placement of the catalyst is achieved by a CVD procedure as is common in the art. In an embodiment, the CVD process is an alcohol-CVD technique as disclosed in Maruyama, et al., *Chem. Phys. Lett.* 2002, 360, 229 and Murakami et al., *Chem. Phys. Lett.* 2003, 377, 49.

In an embodiment, formation of metal catalysts particles comprises a coating process that at least partially mimics various commercial coating technologies. Embodiments of this technology permit large scale coating of metal foil (substrate) with a SWNT growth catalyst. The growth catalyst layer is typically constructed of a 10 nm thick aluminum oxide film which is over coated with a 0.5 to 1 nm thickness of iron. The iron is not a continuous layer and exists as small islands. These islands coalesce into nanometal particles of the order of 1 nm when the substrate is heated and nucleate a SWNT with a diameter set by the size of the metal island.

The growth of SWNT carpets on silicon substrates and recently on metal foils has opened up the possibilities for creation of new materials such as electrically and thermally non-isotropic neat and composite fibers, tapes, conductive films, nanopore membranes, and/or the like.

As such, in an embodiment, a method of the present invention generally comprises:

placing at least one catalyst particle on a substrate surfaces by vapor deposition methods or as preformed metal clusters or as metal atoms or clusters on metal oxides such as alumina, silica and magnesia;

contacting the substrate with a gas mixture comprising hydrogen and a carbon containing species;

activating the gas mixture; and, heating the substrate with the activated gas.

Important characteristics of nanotubes produced according to this method are that they are at least one of ultra long, of uniform length, and/or highly aligned to each other. The built in alignment permits ready dispersion into liquids as aligned domains and liquid phase processing into fibers, tapes, membranes and conductive thin films. Alternatively, vacuum infiltration of carpets by various polymers, ceramics and coating with metals creates SWNT tapes useful for structural, electrical and thermal applications.

In a further embodiment, methods of the present invention are used as a two stage growth procedure wherein at least partial growth of a nanotube is performed with a method comprising placing at least one catalyst particle on a substrate surfaces; contacting the substrate with a gas mixture comprising hydrogen and a carbon containing species; activating the gas mixture; and, heating the substrate with the activated gas, and further wherein a conventional growth method is conducted.

In various embodiments, nanotubes produced according to embodiments of the present invention provide semiconductor devices, wherein the devices include a nanotube, for example a carbon nanotube. Also provided are methods for fabrication of carbon nanotube semiconductor devices. The present invention need not be limited to the particular semiconductor devices illustrated in the figures nor the particular embodiments of the same. Other semiconductor devices or embodiments of the semiconductor devices illustrated in the drawings may be formed using the methods of the present invention. For example, the devices and methods provided herein may include individual carbon nanotubes or collections/arrays of carbon nanotubes.

In various embodiments, the prepared nanotube and/or array of nanotubes exhibits optical anisotropy due to the alignment of the nanotubes.

In various embodiments, the resistance of a nanotube, and/or nanotube carpet, of an embodiment of the present invention is between about 0.1 k$\Omega$ and about 10.0 k$\Omega$. In an alternate embodiment, the resistance of a nanotube of an embodiment of the present invention is between about 2.0 k$\Omega$ and about 8.0 k$\Omega$. In an alternate embodiment, the resistance of a nanotube of an embodiment of the present invention is between about 3.0 k$\Omega$ and about 7.0 k$\Omega$. In general, any resistance can be chosen to function with the desired process.

In various embodiments, composition of the carpets with respect to tube type is controlled, such that metallics are eliminated from the carpet. The removal of metallics may be accomplished by any method common in the art and anywhere within the process of fabricating/growing the carpet. Exemplary, non-limiting embodiments include, but are not limited to wet chemical selective functionalization, high current metallic tube burnout, and/or the like.

However, in an alternate embodiment, a SWNT can be grown onto metal films with thin insulator layers and still retain some conductivity. Talapatrala, et al., "Direct Growth of aligned carbon nanotubes on bulk metals," Department of Material Science & Engineering, Rensselaer Poytechnic Institute, 22 Oct. 2006. Further, a MWNT is capable of being grown directly onto metal substrates and have conductivity through the structure In various embodiments, synthesized carbon nanotubes randomly form in a mixture or collection of conducting and semiconducting electronic states when grown by conventional synthesis processes. In such cases, it is desirable to separate the two components. In fact, in various embodiments, the inability or failure to effectively separate nanotubes of different electronic states has hindered the maturation of carbon nanotube hybrid device structures. Any method common in the art can be used to separate the semiconducting carbon nanotubes and conducting carbon nanotubes.

Accordingly, various embodiments of the present invention disclose a method for producing at least one vertical small diameter single walled nanotube, said method comprising the step of: placing at least one catalyst on a nanotube growth substrate surface; contacting the substrate with a gas mixture comprising hydrogen and a carbon containing species in a reaction chamber, heating the substrate and said activated gas; and, activating the gas mixture, wherein at least one vertical small diameter nanotube is produced at said at least one catalyst on said nanotube growth substrate.

Alternate embodiments further comprise the step of further growing said at least one nanotube by a conventional growth process.

In various embodiments, the at least one nanotube grows at about 2.5 µm per minute.

The nanotubes produced according to embodiments of the present invention can be used in any of a number of semiconductor devices, as is known in the art.

Further embodiments disclose a method of reducing the heat generated from an integrated circuit comprising the step of replacing said integrated circuit's silicon with a carbon nanotube formation as herein disclosed.

Further embodiments disclose a method of increasing the operating speed of a semiconductor device comprising the step of replacing said integrated circuit's silicon with a carbon nanotube formation as herein disclosed.

EXAMPLES

Developments in the art field coupled with the novel and non-obvious additions of is disclosure illustrate enablement of the appended claims. Namely, Applicants have discovered improved methods of production of at least one vertical nanotube.

Single-walled carbon nanotubes (SWNTs) have been intensively studied because of their many potential applications. Previous studies have shown that vertical arrays of SWNT, SWNT carpets or forests, can he readily grown in the presence of hydrogen and various hydrocarbons at sub-atmospheric pressures (0.5-30 Torr) where the gas mixtures are activated with microwave or RF discharge. Gas activation results in the formation of atomic hydrogen and free radical species containing carbon. Carbon nanotubes are formed when the activated gas is exposed to substrates on which particles of metal catalysts are present where the metal is a catalyst that is known to catalyze the growth of carbon nanotubes. It has also been previously shown that hot filament activation of gas mixtures of hydrogen and hydrocarbons activates the growth of multi-walled carbon nanotubes (MWNTs) in the presence of metal catalysts. However, embodiments of the present invention limit and/or hinder such growth.

In general, in this study, a hot filament (in an embodiment, a temperature greater than 2000° C.) was used to activate gas mixtures of hydrogen and carbon containing species at sub-atmospheric pressures. Silicon substrates decorated with islands of iron were directly inserted into a preheated furnace in which a hot filament is used to activate the gas. Vertical arrays of SWNT are produced with diameters ranging from 0.78 to 1.6 nm.

It has been shown that carpets (forests) of vertically aligned single walled nanotubes of approximately uniform height can be grown onto substrates (generally alumina). See Hata et al., "Water-Assisted Highly Efficient Synthesis of Inpurity-Free Single-Walled Carbon Nanotubes," *Science* 2004, 306, 1362-1364; Murakami et al., "Growth of vertically aligned single-walled carbon nanotube films on quartz substrates and their optical anisotropy," *Chemical Physics Letters* 2004, 385, 298-303; Xu et al., "Vertical Array Growth of Small Diameter Single-Walled Carbon Nanotubes," *Jam Chem Soc* 2006, 128, 6560-6561.

Growth

In an embodiment, substrates on which small particles of iron have been vacuum deposited are rapidly heated in the presence of an activated gas. An activated gas is generated by rapidly flowing gas mixtures, typically 400 sccm $H_2$ and 40 sccm at pressures of 15-25 torr, over a hot filament (temperature greater than 2000° C.) to create activated gas mixtures of hydrogen and carbon containing species.

The substrate is supported in an open quartz boat which is mechanically inserted from the down stream side and placed about 5 mm from the hot filament. The hot filament is located near the center of the furnace and the center of a 25 mm diameter quartz tube. The filament is about 8 mm long and made from 10 mill tungsten wire. Typical filament operating voltages and currents are 4 volts and 11 amperes respectively. Filaments were brought up to the operating temperature over about 10 minutes to allow for filament carburization. Li this embodiment, a small percentage of the methane is converted to acetylene and ethylene by the filament. A typical run involved generation of a about 2% acetylene/methane ratio. In this embodiment, the metal catalyst Fe was vacuum deposited as a 1 nm thin film on a 10 nm $Al_2O_3$ film previously vacuum deposited on an oxidized silicon wafer with a 35 nm layer of SiO.

The combination of substrate heating in the presence of an activated gas is thought to be important, but not critical, because metal particle size determines the diameter of a single-walled carbon nanotube that form on a metal catalyst particle. When substrates are heated slowly to temperatures necessary for growing single-walled carbon nanotubes, (temperatures typically greater than 600° C.) metal particles with diameters of 1-2 nm can readily move about on a substrate and aggregate into larger particles. This typically leads to growth of larger diameter and multi-walled nanotubes. Thus achieving the lowest possible temperature before surface particle diffusion occurs at which nucleation and initial growth of single-walled carbon nanotubes can occur is very important to growing S with the smallest possible diameters.

The results of this study suggest that the simultaneous presence of atomic hydrogen and reactive hydrocarbon species such as methyl radicals cause the nucleation and growth of single-walled carbon nanotubes at the lowest possible temperatures and in the shortest possible time when a substrate initially near room temperature is heated to a steady state growth temperature (typically greater that 650° C.).

In our experiments, the substrate is placed in a quartz boat that is attached to a 10 inch quartz rod which is attached to a small stir bar magnet that is encased in quartz, The boat is placed on the downstream side of the quartz tube and is always at room temperature until inserted into the furnace. After heating the furnace to 750° C., the filament was heated to 2000° C. The flow of methane was then gradually increased to 40 ml/mm over a ten minute time period. The filament undergoes carbonization and a change in resistance during this period. A final temperature adjustment of the filament is made such that a small amount of the methane is decomposed into acetylene and ethylene. Typical acetylene concentrations relative to methane are about 2%. After stabilization of the filament resistance, the substrate is rapidly inserted into the furnace. After an allotted number of minutes for growth the filament and methane flow are turned off. The substrate is removed from the furnace to the downstream cool zone. The furnace is then turned off and the system cooled to room temperature in a low flow of hydrogen.

It is hypothesized that atomic hydrogen is only required during the nucleation stage where its most important role is the reduction of the catalyst to the zero-valent metallic state that rapidly reacts with an acetylene carbon source. With atomic hydrogen, nucleation can be carried out at a low temperature, i.e., about 550° C. which minimizes the surface mobility and coalescence of the nanometal particles. Continuous growth can be carried out at higher temperatures in the about 700 to about 900° C. for periods of minutes to hours depending on the desired length of SWNT. In general, continuous growth can occur for any length of time.

With the above conditions it is observed that well-aligned vertical arrays of small diameter SWNTs are produced.

If samples are first placed in the furnace prior to heating the filament, carpet growth is not observed. Also if the substrate undergoes prior oxidation at evaluated temperatures or is exposed to an oxygen discharge, carpet growth has been found to produce much larger diameter nanotubes which suggest that these treatments cause metal particle aggregation.

The characterization of each sample was documented by SEM, TEM, fluorescence, and Raman spectroscopy. SEM pictures were taken with a JEOL 6500 SEM. FIG. 1 shows carpet SWNTs grown with different times. We found that carpet thickness, and presumably nanotube lengths have a linear relation to the growth time. The average growth rate was found to be 2.5 µm per minute.

Figure 2:
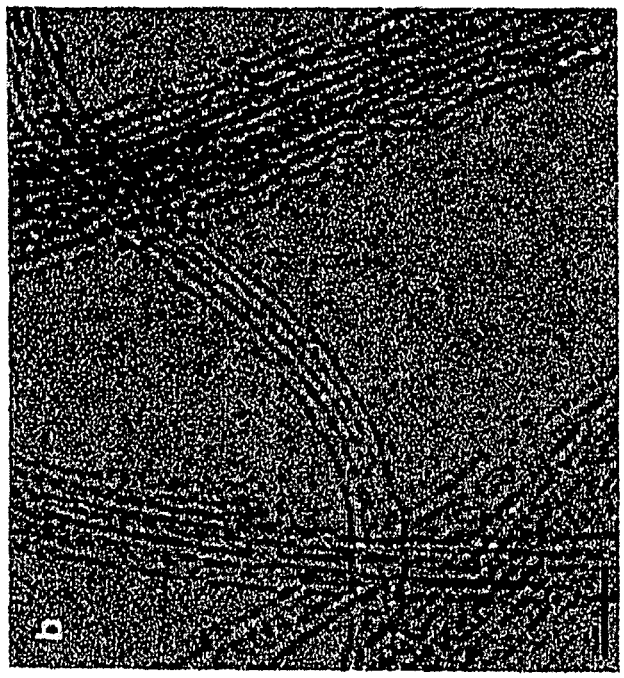
FIG. 2 are a Transmission Electron Microscope (TEM) images of SWNT carpet at: (a) scale bar 20 nm, and (b) scale bar 10 nm.
Figure 2:
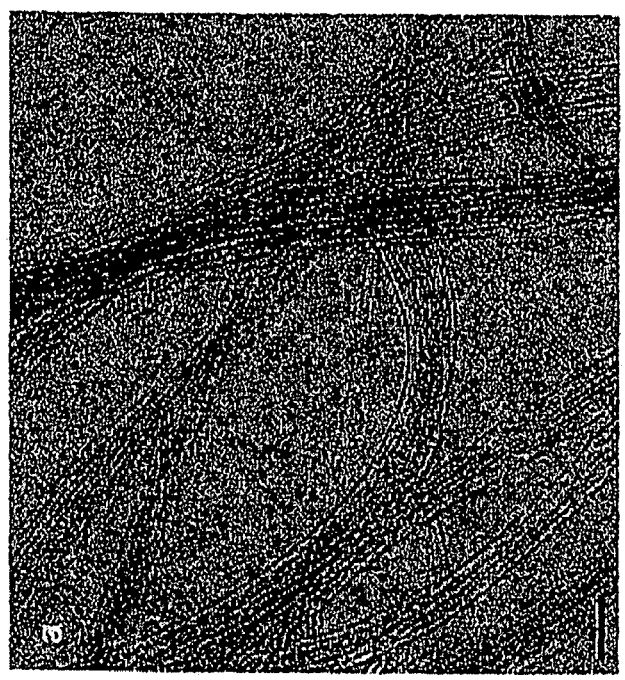

TEM images were obtained with a JEOL 2011 TEM at 200 KV. As shown in FIG. 2, all the observed nanotubes are SWNTs with diameters less than 2 nm, in agreement with fluorescence and Raman spectra, where a diameter distribution of SWNTs from 0.8 to 1.6 nm was found.

Fluorescence spectroscopic measurements were taken with a J-Y Spex Fluorolog 3-211 equipped with an indium-gallium-arsenide near—infrared detector cooled by liquid nitrogen. Emission intensity was measured as a function of emission wavelength (from 800 to 1570 nm), with excitation wavelength 669 nm. The sample was dispersed in 1 wt % SDBS surfactant and sonicated for 10 minutes with a tip sonicator.

Figure 3:
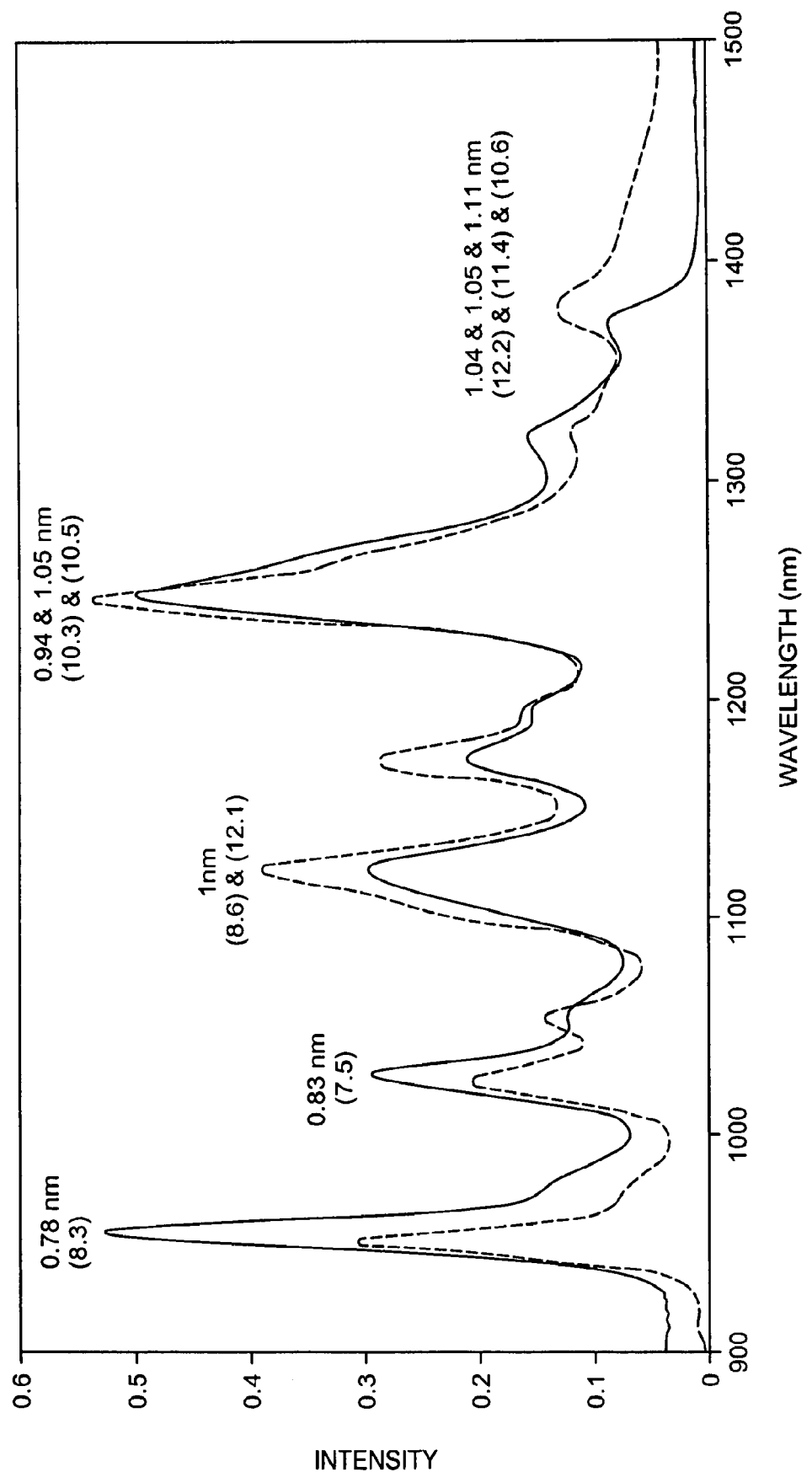
FIG. 3 is a fluorescence spectra of carpet SWNTs (red color) and HiPco SWNTs (blue color).
Figure 4:
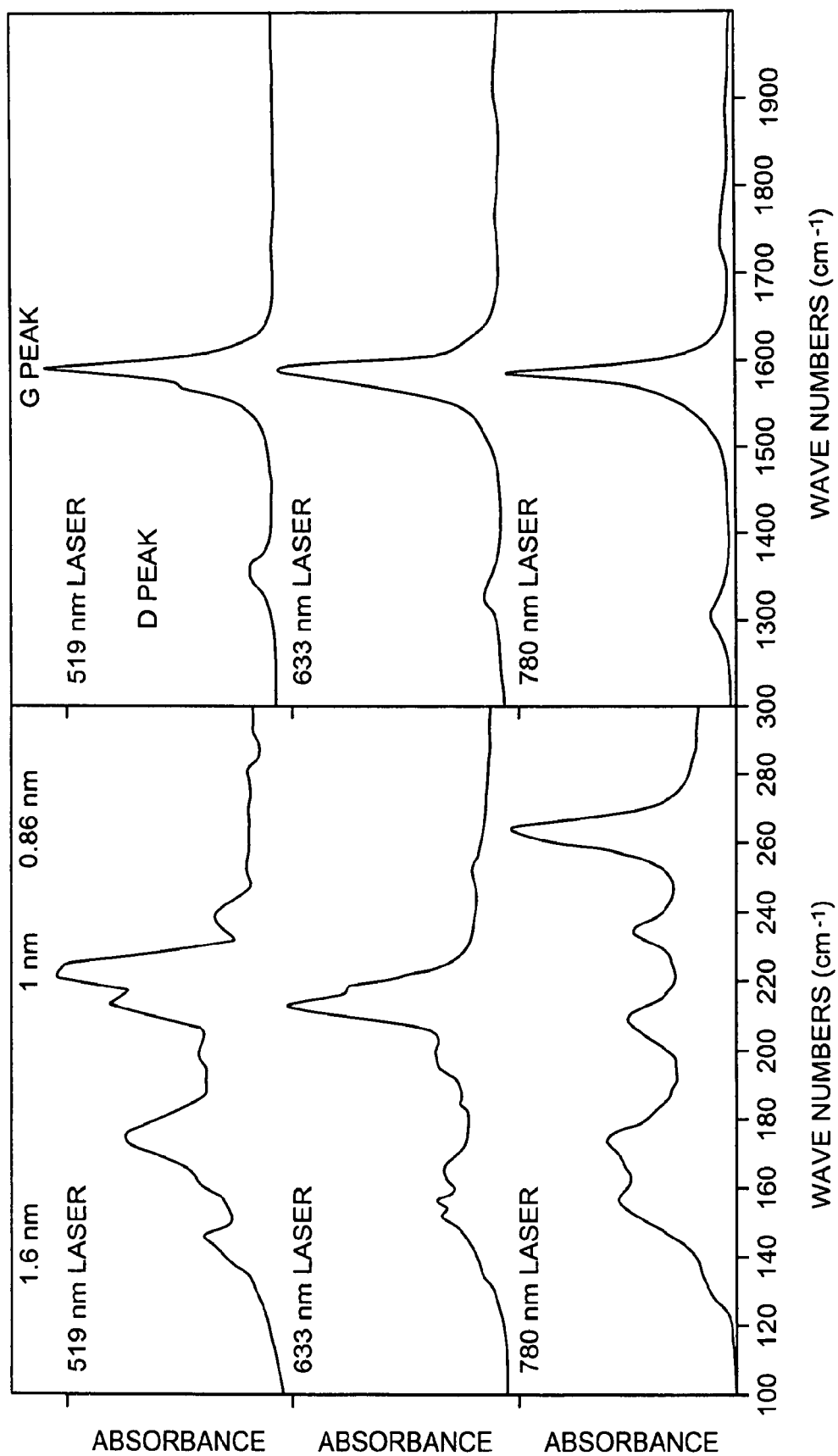
FIG. 4 is a Raman spectrum of carpet SWNTs by different excitation lasers with (a) a 519 nm laser, (b) a 633 nm laser, and (c) a 780 nm laser.

FIG. 3 compares the fluorescence spectra of carpet SWNTs and HiPco (high pressure CO) SWNTs. There are two intense peaks (950 and 1250 nm) in the fluorescence spectrum of carpet SWNTs. Surprisingly the 950 nm peak is as intensive as the 1250 nm peak. This is not the case for HiPco SWNTs, as seen in FIG. 3. This indicates that the SWNT carpet as grown contains a higher percentage of small diameter SWNTs than HiPco. The observed diameters of SWNTs are in the range of 0.78 to 1.1 nm. Raman spectra were collected with a Renishaw micro-Raman spectrometer equipped with 519, 633 and 780 nm lasers and are shown in FIG. 4. Typical SWNT Raman features are observed for the tangential modes and radial breathing modes (RBMs) near 1591 and 200 cm$^{-1}$ respectively. From the RBMs, Ramnan spectra imply a SWNT diameter distribution between 0.8 and 1.6 nm.

Figure 5:
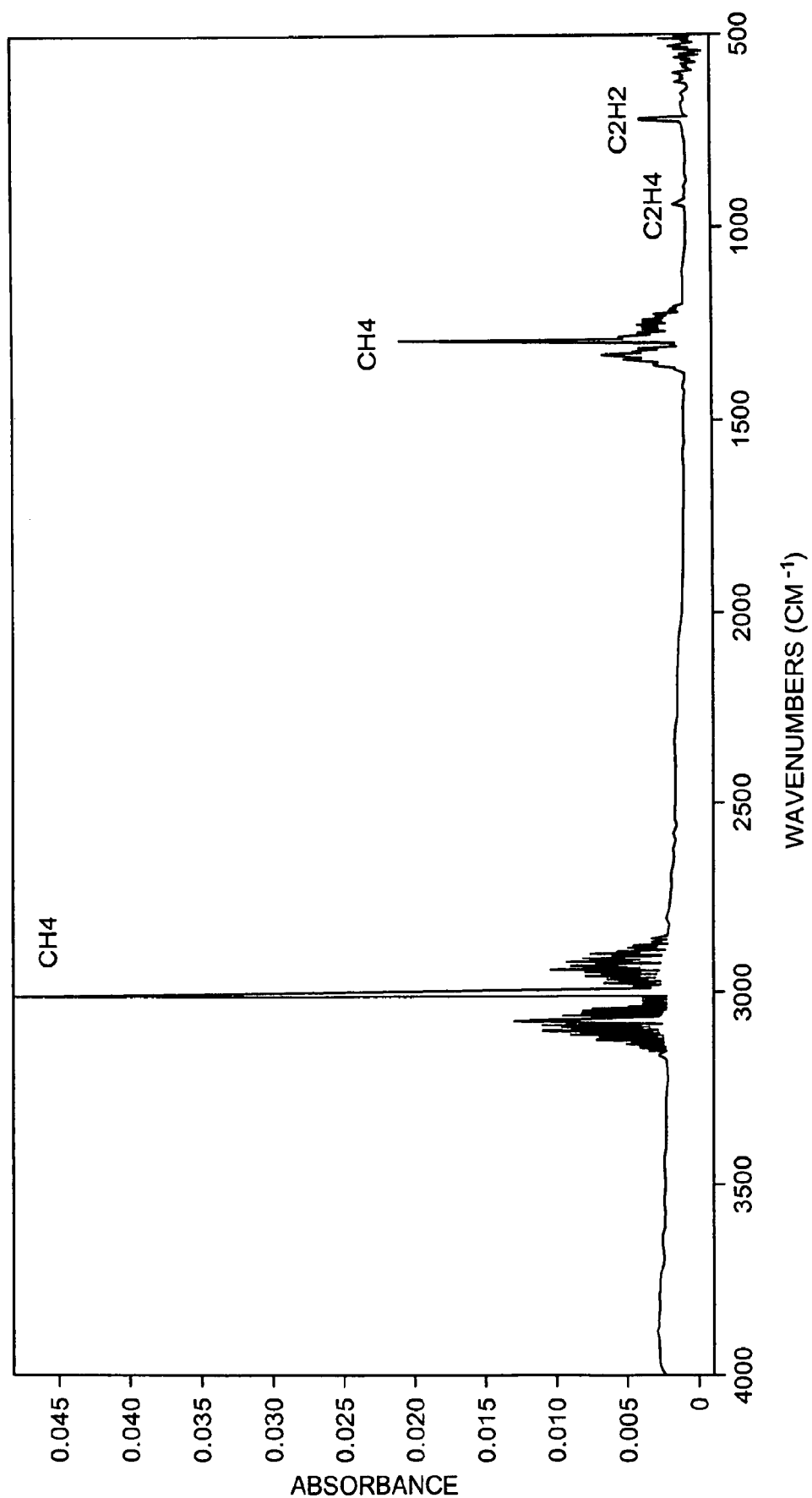
FIG. 5 is a FT-IR spectrum of the effluent gases during the carpet SWNT growth process

In addition, during the growth process the effluent gases were monitored with FT-IR spectroscopy. FIG. 5 shows a typical FT-IR spectrum of the effluent gas during growth. From the spectrum we found that the methane is partially decomposed to ethylene and acetylene by the hot filament with more decomposition occurring at higher temperatures of the filament. In fact reproducible growth conditions could be obtained by heating the filament to a temperature that produces a specific ratio of acetylene to methane.

Figure 6:
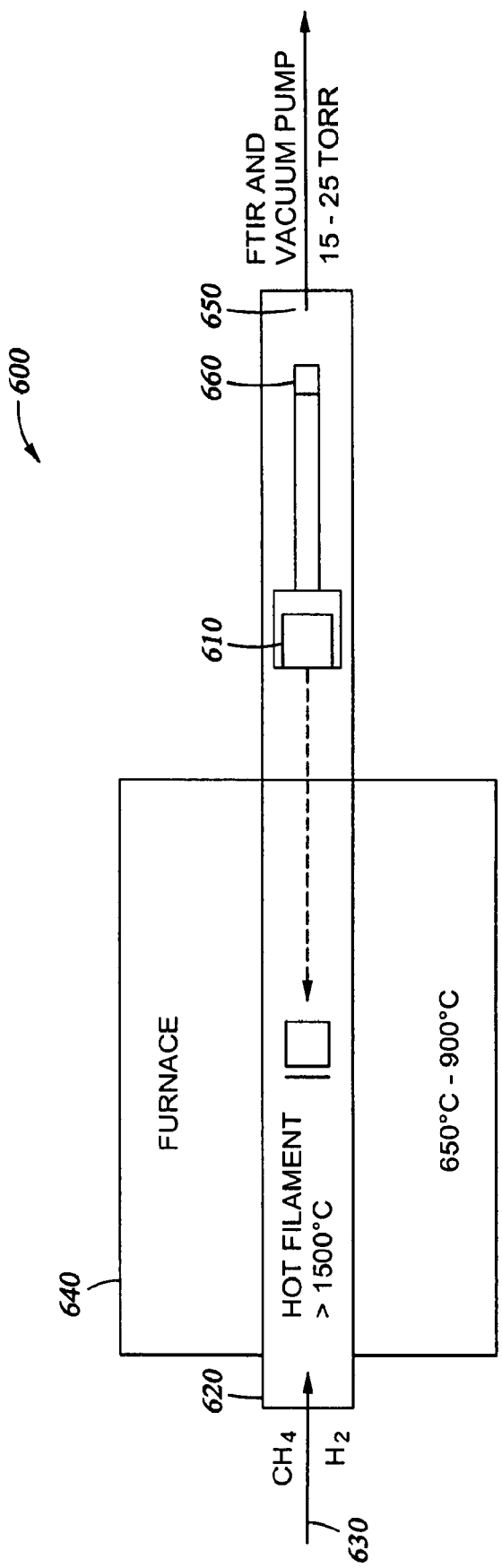
FIG. 6 is an illustration of a schematic top view drawing of a hot filament CVD furnace system used for carpet SWNT growth.

FIG. 6 is an illustration of top view of an system for producing a vertically aligned nanotube carpet as herein disclosed. System 600 generally comprises a reaction chamber 640, a gas injection site 630, hot filament 620, nanotube growth substrate 610, magnetic portion 660, and instrument loading zone 650. Such a system is capable of operating with various embodiments of the present invention.

Figure 7:
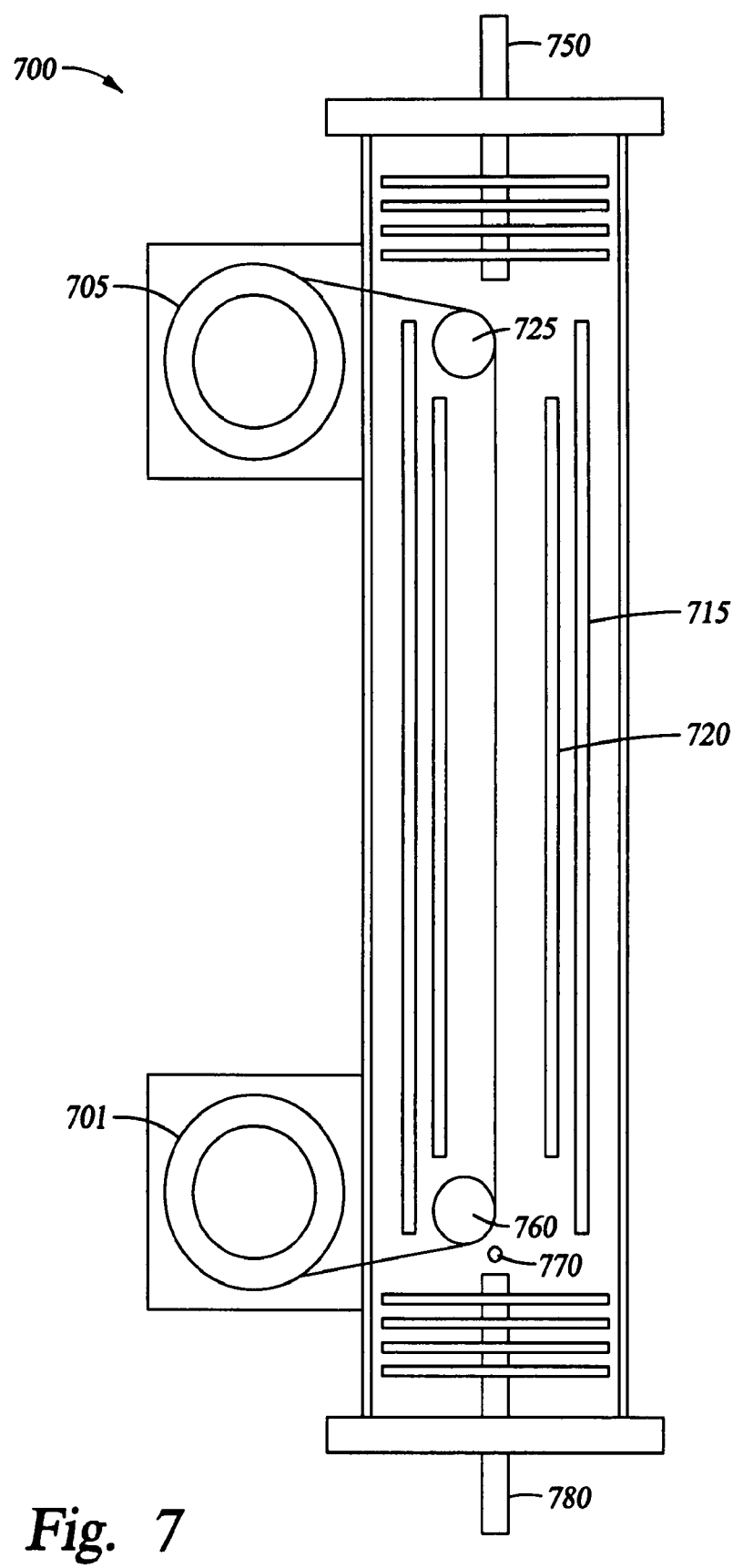
FIG. 7 is an illustration of a schematic top view drawing of a mass production enabled film and/or taper fabricator.

FIG. 7 is an illustration of an embodiment of an apparatus 700 for the large scale growth of SWNT films, tapes, and/or the like. A roll of metal foil on roller 701 that has been coated with catalyst is first passed through a nucleation zone (here, in the embodiment illustrated, the nucleation zone is filament 770 rapidly heating and atomizing a gas comprising at least one hydrogen source and at least one hydrocarbon passing into apparatus 700). At this point the foil is rapidly raised to a temperature best for nucleation as it contacts the first heated roller 760. It then passes through a heated flat panel furnace 720 that is heated to temperatures best for SWNT growth. SWNT is grown to desired lengths and the foil subsequently passed to a take up roller 705, past hot roller 725. The reactor will be built to accommodate varying width foil rolls with varying lengths.

In various embodiments, heat shield 715 is used to at least isolate the elevated temperatures within apparatus 700.

Sensors are capable of being placed to provide measures of critical temperatures, SWNT nucleation and growth. Foil travel, gas flows and operating pressures and SWNT nucleation and growth will be continuously monitored with feed back control.

As such, various embodiments of the present invention comprise said apparatus comprising a first roller system for taking up and letting out a catalyst covered foil, a nucleation zone comprising at least one filament, a heater, a hydrogen source, and a carbon source.

What is claimed is:

1. A method for producing at least one vertical small diameter single walled nanotube, said method comprising the step of:
   placing at least one catalyst on a nanotube growth substrate surface, wherein said catalyst is placed in a pattern on said substrate;
   heating a gas mixture to form an activated gas, wherein said gas mixture is activated prior to introduction to said reaction chamber;
   inserting the substrate into a reaction chamber with the activated gas comprising atomic hydrogen and a carbon containing species, wherein said substrate is kept at room temperature prior to insertion into the reaction chamber; and
   heating the substrate and said activated gas in the reaction chamber, wherein at least one vertical small diameter nanotube is produced at said at least one catalyst on said nanotube growth substrate, and said at least one vertical small diameter nanotube has a diameter less than 3 nm.

2. The method of claim 1, wherein said gas mixture is preheated to a desired temperature prior to contacting said substrate, and said desired temperature activates the gas mixture.

3. The method of claim 1, wherein said gas mixture is a hydrocarbon.

4. The method of claim 1, wherein said catalyst is placed on said substrate by a vapor deposition method.

5. The method of claim 1, wherein said pattern arranges the catalyst into islands on the substrate.

6. The method of claim 1, further comprising the step of further growing said at least one nanotube by a conventional growth process.

7. The method of claim 1, wherein said at least one nanotube grows at 2.5 μm per minute.

8. The method of claim 1, wherein said step of heating said gas mixture is performed with a filament.

9. The method of claim 1, wherein said at least one nanotube is a single walled nanotube (SWNT).

10. The method of claim 1, wherein said nanotube produced is used in a semiconductor device.

11. The method of claim 1, wherein said substrate is heated in said reaction chamber from about room temperature to a desired temperature sufficient to produce said at least one nanotube.

12. The method of claim 11, wherein a pressure of said reaction chamber is at a sub-atmospheric pressure during at least the step of inserting.

13. The method of claim 12, wherein said desired temperature is dependent upon said pressure.

14. The method of claim 12, wherein said pressure is dependent upon said desired temperature.

15. The method of claim 1, wherein the at least one vertical small diameter nanotube produced on the nanotube growth substrate provides an array of semiconductor devices.

16. The method of claim 1, wherein the atomic hydrogen is only utilized during a nucleation stage.

17. The method of claim 16, wherein the reaction chamber is heated to 550° C. during the nucleation stage, and said at least one catalyst is aluminum oxide and iron.

18. The method of claim 17, wherein the reaction chamber is heated to 700-900° C. during a continuous growth stage.

* * * * *

UNITED STATES PATENT AND TRADEMARK OFFICE
CERTIFICATE OF CORRECTION

PATENT NO.        : 8,506,921 B2                                    Page 1 of 1
APPLICATION NO.   : 12/278736
DATED             : August 13, 2013
INVENTOR(S)       : Hauge et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 465 days.

Signed and Sealed this
Fifteenth Day of September, 2015

Michelle K. Lee
*Director of the United States Patent and Trademark Office*